United States Patent [19]

Pinkhasov

[11] Patent Number: 4,609,564

[45] Date of Patent: Sep. 2, 1986

[54] METHOD OF AND APPARATUS FOR THE COATING OF A SUBSTRATE WITH MATERIAL ELECTRICALLY TRANSFORMED INTO A VAPOR PHASE

[75] Inventor: Eduard Pinkhasov, Forest Hills, N.Y.

[73] Assignee: Wedtech Corp., Bronx, N.Y.

[21] Appl. No.: 494,302

[22] Filed: May 13, 1983

Related U.S. Application Data

[63] Continuation-in-part of Ser. No. 358,186, Mar. 15, 1982, Pat. No. 4,438,153, which is a continuation-in-part of Ser. No. 237,670, Feb. 24, 1981, Pat. No. 4,351,855.

[51] Int. Cl.⁴ .................. C23C 13/00; C23C 13/12
[52] U.S. Cl. ..................... 427/37; 118/723; 118/726; 427/250
[58] Field of Search .......... 427/34, 37, 250, 422; 118/720, 723, 726

[56] References Cited

U.S. PATENT DOCUMENTS

| | | | |
|---|---|---|---|
| 1,221,104 | 4/1917 | Stolle | 427/34 |
| 3,010,009 | 11/1961 | Ducati | 427/34 |
| 3,036,549 | 5/1962 | Iwata et al. | 118/726 |
| 3,491,015 | 1/1970 | Naff . | |
| 3,625,848 | 12/1971 | Snaper | 427/37 |
| 3,925,177 | 12/1975 | Kofold | 427/37 |

FOREIGN PATENT DOCUMENTS

| | | |
|---|---|---|
| 1636004 | 7/1971 | Fed. Rep. of Germany . |
| 1648968 | 10/1971 | Fed. Rep. of Germany . |
| 822793 | 9/1937 | France . |
| 979772 | 12/1950 | France . |
| 1400961 | 4/1965 | France . |
| 18970 | of 1914 | United Kingdom .......... 427/37 |
| 889018 | 2/1962 | United Kingdom . |
| 1061949 | 3/1967 | United Kingdom . |
| 1257015 | 12/1971 | United Kingdom .......... 118/726 |
| 1322670 | 7/1973 | United Kingdom . |
| 1392583 | 4/1975 | United Kingdom . |
| 1447224 | 8/1976 | United Kingdom . |
| 1452720 | 10/1976 | United Kingdom . |
| 2010919 | 9/1979 | United Kingdom . |
| 2055403 | 3/1981 | United Kingdom . |
| 2058843 | 4/1981 | United Kingdom . |
| 2093484 | 9/1982 | United Kingdom . |
| 2106545 | 4/1983 | United Kingdom . |

Primary Examiner—John H. Newsome
Attorney, Agent, or Firm—Karl F. Ross; Herbert Dubno

[57] ABSTRACT

Complex shapes are coated with material at least in part evaporated from an elongated electrode shaped to conform to the substrate and juxtaposed therewith over the length of the electrode. An arc is struck at one end and depositions occur over a surface of the electrode which recedes from the arc. The other end of the electrode is heated to maintain the electrode during deposition at a constant temperature.

6 Claims, 7 Drawing Figures

METHOD OF AND APPARATUS FOR THE COATING OF A SUBSTRATE WITH MATERIAL ELECTRICALLY TRANSFORMED INTO A VAPOR PHASE

CROSS REFERENCE TO RELATED APPLICATIONS

This application is a continuation-in-part of my copending application Ser. No. 358,186 filed Mar. 15, 1982 (now U.S. Pat. No. 4,438,153 filed Mar. 20, 1984) which, in turn, was a continuation-in-part of Ser. No. 237,670 filed Feb. 24, 1981 and issued as U.S. Pat. No. 4,351,855 on Sept. 28, 1982.

REFERENCE TO DISCLOSURE DOCUMENTS

This application also deals with subject matter which is related to the subject matter of disclosure documents Nos. 078,337, 078,334 and 078,329, all of Feb. 26, 1979, and disclosure document No. 082,283 filed July 5, 1979. These disclosure documents are hereby incorporated in the file of the present case, by reference and in their entirety.

FIELD OF THE INVENTION

My present invention relates to a method of and an apparatus for the coating of a substrate with a material which is brought into the vapor phase by electrical means. More particularly, the invention relates to an improvement in the method of and apparatus for vapor deposition of material upon a substrate described and claimed in the aforementioned applications with a view to increasing the area over which coating can be effected with material evaporated from an electrode, and of increasing the complexity of the surfaces which can be so coated.

BACKGROUND OF THE INVENTION

As pointed out in the aforementioned copending application, the deposition of material from a vapor phase onto a substrate is well known in the coating art and in the field of surface transformation of a substrate. Generally speaking, a body of the material to be transferred to the substrate is heated in the region of this substrate and transformed first into a molten state and then into a vapor state. The material thus undergoes two phase transformations, namely, the transformation from the solid phase to the liquid phase and then from the liquid phase to the vapor phase.

The coating is generally effected in a vacuum and usually a relatively high vacuum must be drawn to permit transfer of vapors from the source to the substrate.

Earlier systems may use induction heating to effect the aforementioned phase transformation.

In the aforementioned copending applications, I have described an improvement over these earlier systems in which a substance, generally a metal may be transferred to a substrate also in a vacuum environment, utilizing an electrode as the source of the material, by the process which involves striking a more or less stable arc between the molten material and a counterelectrode to thereby generate the vapors.

Coating in this manner can be effective to apply anticorrosion, protective, decorative, conductive, semiconductive or other coatings upon a substrate and I am also able to form compounds on the substrate between materials deposited and substances on the substrate or two materials to be deposited. For example the latter of the two applications describes also the formation of carbides, borides, silicides, nitrides and silicon carbides.

Process of Ser. No. 358,186

While the process of this latter application cannot be considered prior art with respect to the instant invention, a brief review thereof may be advantageous since it serves as a background to the instant improvement.

Thus this application discloses a method of vapor-depositing material upon a substrate which, as indicated, utilizes an electrical arc struck between a pool of molten material and a counterelectrode, thereby vaporizing the material on the surface of the pool and permitting transfer of the vaporized material in the vapor state to the substrate in the vacuum chamber.

The pool of molten metal, in turn, can be formed by striking an arc between this counterelectrode and an electrode composed of the material to be vapor deposited, the heat of the arc initially melting the material of this latter electrode to form the pool. The body of the material to be vaporized has a larger cross section than the arc-striking electrode so that the pool of molten material is formed in this body and a cavity is created therein to receive this pool. One advantage of this is that it eliminates the need for a support crucible or container for the pool of molten material.

In this earlier system, moreover, I may move the counterelectrode into and out of contact with the pool to thereby deposit some of the melt upon the counterelectrode and permitting the heat generated at the electrode tip to vaporize at least in part the material transferred to it and thus in part generate the vapors which are to be transferred to the substrate.

In the system described in this application, the initial vacuum is generated to a reduced pressure of the order of $10^{-6}$ torr while the operating pressure is at a maximum of $10^{-5}$ torr and effective results were found requiring 100 to 250 amperes of electric current flow through the arc across a voltage of 70 to 120 volts, direct current. These levels of vacuum are generally higher than those which were used theretofore and the currents used were likewise considerably greater. The deposition speeds were generally 0.1 to 0.3 grams per minute.

That system (as is the case with the present system) could be used for generating silica, silicide or carbide coatings upon a substrate, for producing silicides by the reaction of silicon with a substrate material upon vapor deposition of the silicon upon the substrate, or for coating substrates with practically any desired metal or alloy to form protective coatings or coatings for other purposes.

The use of the system has been found to be widespread and metallurgical, chemical, electrical, electronic, ultravacuum, optical, rocketry, aerospace and nuclear industrial use can be found for the products. The method has been found to be especially effective for generating mirror-like coatings, producing reflectors, for applying anticorrosion coatings and films, for products of flat and other configurations, and for producing multilayer coatings in films for semiconductor components, high ohmic resistors and wherever surface modification of a substrate is required. Metal nitride coatings were formed when nitrogen was admitted to the evacuated space which then had its vacuum stabilized at about $2.5 \times 10^{-3}$ torr. The vaporized electrode material combines with nitrogen and the corresponding nitrides are deposited.

The two-electrode system can be used to form compounds in situ from materials of both electrodes. One electrode can be a metal electrode composed of high purity, titanium, tungsten, aluminum or copper while the other electrode could be a silicide, boride or carbide (or silicon, boron or carbon) so that the deposit is a silicide, boride or carbide of the high purity metal. When one electrode is graphite or carbon and the other is silicon, silicon carbide is formed in the arc and is deposited. When both electrodes are silicon or boron, the coating is silicon or boron.

OBJECTS OF THE INVENTION

It is the principal object of the present invention to extend the principles set forth in the aforementioned applications and thus to provide an improved method of and apparatus for the deposition of materials upon a substrate whereby disadvantages of prior art techniques are avoided.

Another object of this invention is to provide a method and an apparatus for the vapor deposition of material on large-area and/or complex configuration substrates at relatively low-energy cost and with improved uniformity.

It is also an object of the invention to provide a method of and an apparatus for the high-speed coating of complex and/or large-area surfaces.

SUMMARY OF THE INVENTION

These objects and others which will become apparent hereinafter are attained in accordance with this invention, in a method of vapor deposition which generally utilizes the principles set forth above but which is based upon my discovery that especially large-area surface deposits can be formed by juxtaposing an elongated electrode of the depositing material, laterally with the surface of the substrate to be coated over a substantial portion of the length of the electrode in a vacuum, and striking an arc between one end of this electrode and a counterelectrode such that the arc current should be between 50 and 90 amperes with a voltage applied across the electrodes of 30 to 60 volts.

Surprisingly, once the arc is struck as the two electrodes are separated, the arc, a portion of the arc or a heating effect generated by the arc appears to spiral around the long electrode and cause vaporization of the material of the electrode in a generally helical or spiral pattern progressively moving away from the counterelectrode.

It is indeed a remarkable surprise that the arc is not confined to the space between the two electrodes but rather has a component or an effect which spirals away from the counterelectrode toward a region of the length of the long electrode which is further removed from the counterelectrode in spite of the fact that the greatest conductivity would appear to lie in a line directly between the two electrodes where the major portion of the arc appears to be confined. This effect is manifest in the fact the long electrode, i.e. the deposition electrode, while originally of uniform cross section, develops a taper toward the counterelectrode and coating from the blank of the deposition electrode onto the substrate can be observed at considerable distances from the arcs striking face of the deposition electrode.

In fact, the effect appears to survive for a brief period following extinction of the original arc and hence I prefer to periodically contact and separate the electrodes to generate the arc and then allow extinction thereof.

According to a feature of the invention, means is provided at an end of the electrode of the material to be deposited, remote from the arc-striking electrode to control the temperature of the material-supplying electrode, generally to maintain it in the range of 800° F. to 1000° F., the speed under the lower voltage, lower current and temperature conditions of the present invention, at which the material evaporates from the material-supplying electrode, can be increased by 1.5 to 2.0 times the speed of evaporation of the earlier applications. Practically all metals, alloys, carbides and silicides can be used in making the material-supplying electrode. In addition to metals and other alloys, carbides, borides, silicides and nitrides can be deposited on the substrate.

While I do not fully understand why the rate of evaporation of the material to be deposited increases with the lower energy utilization of the present invention, it is possible that the migration of the arc may spread the otherwise pooled molten phase over a wider area of the material-supplying electrode to allow, in effect, evaporation of the molten metal in thin film form.

BRIEF DESCRIPTION OF THE DRAWING

The above and other objects, features and advantages of the present invention will become more readily apparent from the following description, reference being made to the accompanying drawing in which.

SPECIFIC DESCRIPTION

Figure 1:
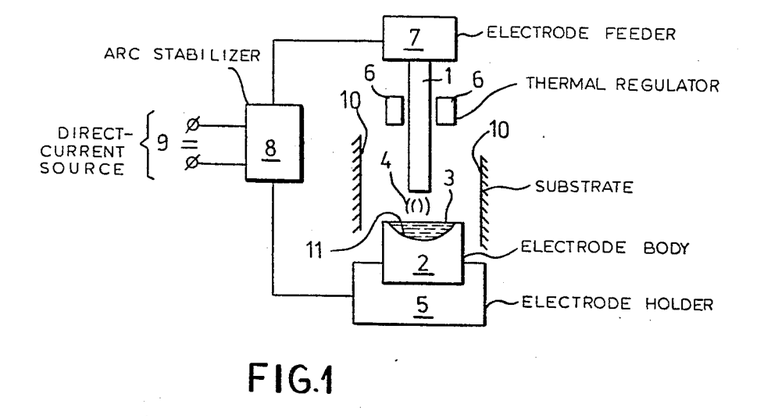
FIG. 1 is a diagram in elevational view illustrating an apparatus for carrying out vapor deposition in accordance with an embodiment of the present invention.

In FIG. 1 I have shown a system utilizing a simple arc method in accordance with the present invention for obtaining mirror-like protective coatings upon substrates or for evaporating various metals or metal alloys, including heat-resistant and refractory metals, to apply coatings thereof to the substrate.

Figure 6:
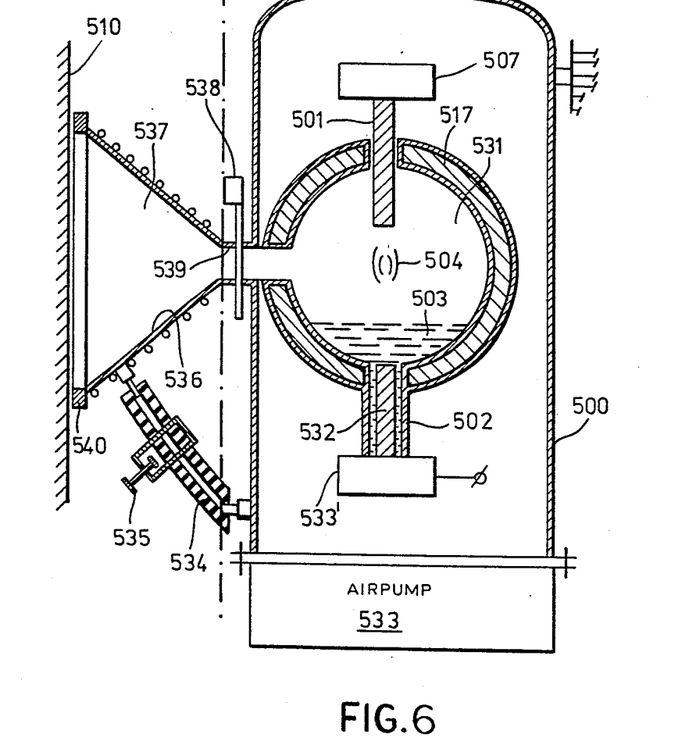
FIG. 6 is an axial cross-sectional view of a highly compact portable apparatus for carrying out the method of the invention.

As is apparent from FIG. 1, the basic apparatus can include a vacuum chamber, not shown, which can be similar to the vacuum chamber of FIG. 6 and in which a metal electrode 1 can be fed by an electrode feeder 7 toward an electrode body 2 to form the pool 3 of molten metal with which the arc 4 is struck.

The electrode body 2 is held in a fixture or holder 5 and the direct-current source applies the arc current across the electrode 1 and the body 2 via a conventional arc stabilizing circuit represented at 8.

It has been found to be advantageous to provide the relatively small cross section electrode 1 with a thermal regulator 6 tending to prevent overheating of this electrode.

Since the cross section of body 2 is substantially larger than that of the electrode 1, the pool 3 lies in a concave recess formed in situ in the body 2.

EXAMPLE 1

The apparatus of FIG. 1, utilizing electrodes 1 and 2 of titanium, aluminum, tungsten, tantalum or copper, strikes an arc at a temperature of 5000° to 7000° F. to generate vapor of the metal of the pool 3 which traverses the distance of 10 to 15 cm to the substrate 10 and form a coating of the metal thereon. The pool 3 can be formed by a mixture of metal contributed by the electrodes 1 and 2, thereby depositing an alloy of the metals of the two electrodes upon the substrate. Preferably the electrode is composed of titanium while the molten metal predominantly consists of aluminum, tungsten, tantalum or copper.

The apparatus of FIG. 1, without substantial modification, can be utilized in a noncrucible method of generating protective coatings of carbides, for producing silicide coatings on the substrate or for forming carbide or silicide and even silicon carbide layers upon the substrate. To deposit silicon carbide-tungsten carbide layers upon the substrate, electrode 2 is composed of graphite and electrode 1 of tungsten silicide. The vacuum is initially drawn to $10^{-6}$ torr and maintained at $10^{-5}$ torr or lower. The direct current arc-generating voltage is 100 volts and the arc current 150 amperes. The deposit forms at a rate of about 0.2 grams per minute.

In this case, the apparatus of FIG. 1 is used, again in the usual vacuum chamber, although the electrode 1 can be composed of silicon or carbon while the electrode 2 is composed of a metal whose silicide or carbide is to be formed or, in the case of a deposit of silicon upon the substrate, can also consist of silicon.

For example, when a silicon carbide deposit upon the substrate 10 is desired, the electrode 1 may consist of silicon while the electrode 2 is a carbon block in which a pool 3 of silicon and solubilized carbon is received.

The vapors are transferred to the substrate and deposited in a silicon carbide layer thereon. The substrate may be titanium and the deposit formed on the substrate may be a mixture of titanium silicide and titanium carbide.

Alternatively, when the electrode 1 is composed of silicon or carbon, and the electrode body 2 is composed of titanium, titanium carbide or silicide can be deposited on a substrate of a different composition.

When a slight oxiding atmosphere is provided in the evacuated chamber, silicon dioxide deposits are formed on the substrate.

Obviously the apparatus of FIG. 1 is particularly effective in the production of semiconductors.

The thermoregulator 6 may be duplicated along the length of the electrode 1 and additional thermoregulators may be provided for the electrode body 2 to prevent overheating thereof.

When either the electrode 1 or the body 2 is composed of silicon and the other is composed of carbon, silicon carbide is generated by the reaction and deposits in a higher purity than that of the original silica and carbon.

When both of the electrodes are composed of silicon, high density silica and silicon deposits can be obtained as is particularly desirable for the coating of semiconductors.

Figure 2:
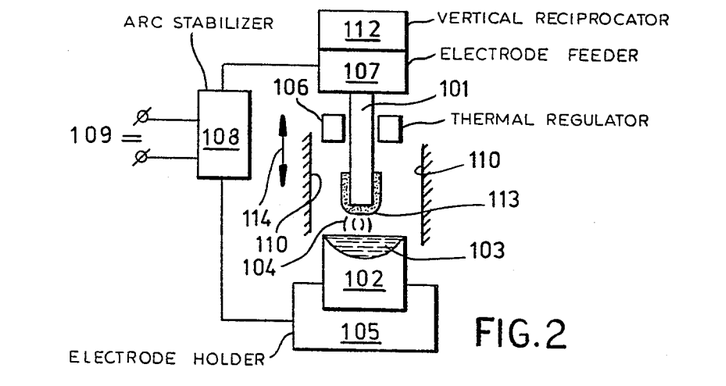
FIG. 2 is a similar view of another apparatus wherein, however, the vapor deposited material is collected on a vertically reciprocal electrode.

The apparatus of FIG. 2 is generally similar to that of FIG. 1 but operates under somewhat different principles, the evaporation being effected at least in part from the wetted upper electrode 101.

In this figure, elements which correspond to those of FIG. 1 utilize similar reference numerals differing in the hundreds position.

In FIG. 2, the electrode feeder 107 is coupled with a vertical reciprocator 112 which imparts a reciprocation to the electrode 101 in the direction of the arrow 114 so as to periodically plunge the tip of the electrode 101 into the pool 103 of the molten metal formed in the electrode body 102.

Upon rising from this pool to restrike the arc 104, the coating 113 of molten metal upon the electrode 101 is evaporated and the deposit is formed upon the substrate 110.

The electrode body 102 is shown in the holder 105 and the arc current supply is formed by the direct current source 109 and the stabilizer 108 in the manner described, the electrode 101 being provided with the thermoregulator 106.

This system has been found to be particularly effective, in a modification of the foregoing example, when the electrode 101 is composed of titanium and the pool 103 is formed of aluminum.

Figure 3:
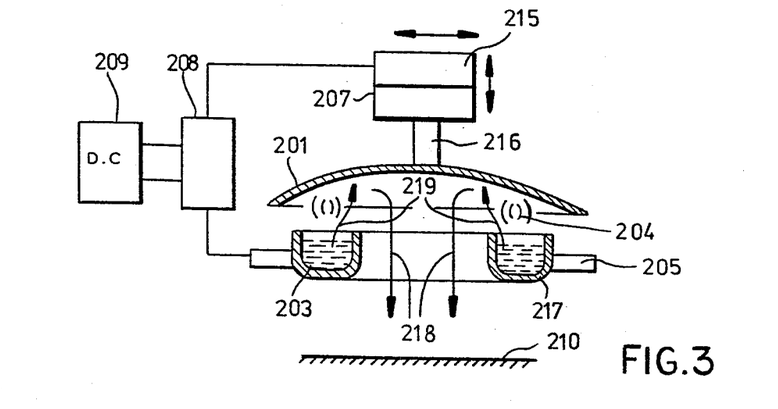
FIG. 3 is a vertical section, also in diagrammatic form, illustrating an apparatus for depositing material upon a substrate disposed below the pool of metal.

In FIG. 3 I have shown an embodiment of the invention in which the vapor is deposited upon a substrate 210 disposed below a crucible 217 in the form of an upwardly open ring containing the molten metal 203, the crucible being mounted in a holder or frame 205.

Here the upper electrode 201 is in the form of a spherical segment which functions as a reflector so that, when an arc 204 is struck between the electrode 201 and the melt in the crucible 217, the vapors pass upwardly as represented by the arrows 219 and are reflected downwardly to focus upon the substrate 210 as represented by the arrows 218.

The direct current source 209 is here connected across the electrode 201 and the crucible 217 via the arc stabilizer 208 and the upper electrode 201, mounted on the rod 216, is vertically positioned by the feeder 207 and horizontally positioned by an auxiliary mechanism 215 which adjusts the position of the electrode 201 over the evaporating metal.

In this embodiment, the electrode 201 can be composed of titanium, molybdenum or tungsten while the molten metal can be composed of aluminum or copper and the crucible 2 of graphite.

Figure 4:
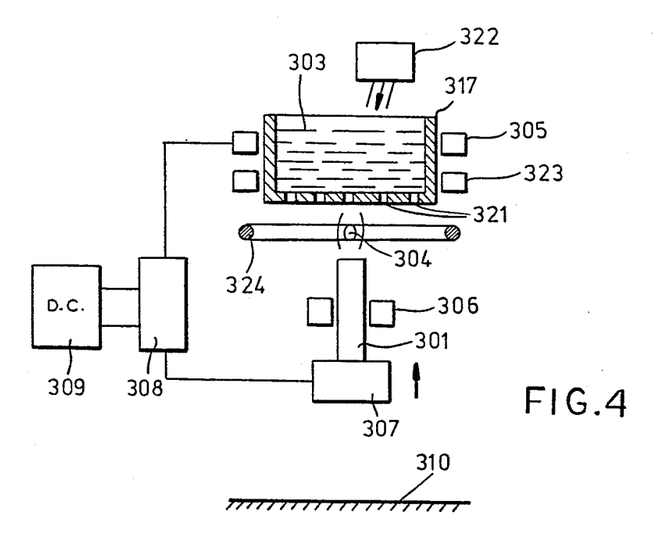
FIG. 4 is a view similar to FIG. 3 illustrating another embodiment of the invention.

In FIG. 4 I have shown another embodiment of the invention in which the vapors flow downwardly to deposit upon the substrate 310.

In this case, the upwardly open crucible 317 containing the molten metal 303 can be supplied with additional molten metal from a ladle or other sources represented at 322 or with solid metal which is melted in the crucible 317. The latter can be heated by auxiliary means such as an inductive heater 323 and is supported in a holder 305.

The bottom of the crucible 317 is formed with apertures 321 at which droplets of the molten metal appear, these droplets being vaporized by the arc 304 struck between the electrode 301 and the bottom of the crucible 317.

The temperature in the region of the arc can be controlled by an auxiliary inductive means 324 and the electrode 301 can be cooled as represented by the cooling element 306.

Electrode 301 is fed toward the crucible 317 by the electrode holder 307 and the arc is maintained by an arc stabilizer 308 connected to the direct current source 309.

In this embodiment, the molten metal may be copper.

In place of the auxiliary device 324, a substrate to be coated may be provided at this location, e.g. in the form of a titanium ring, which can collect the vapor in the form of a coating.

Figure 5:
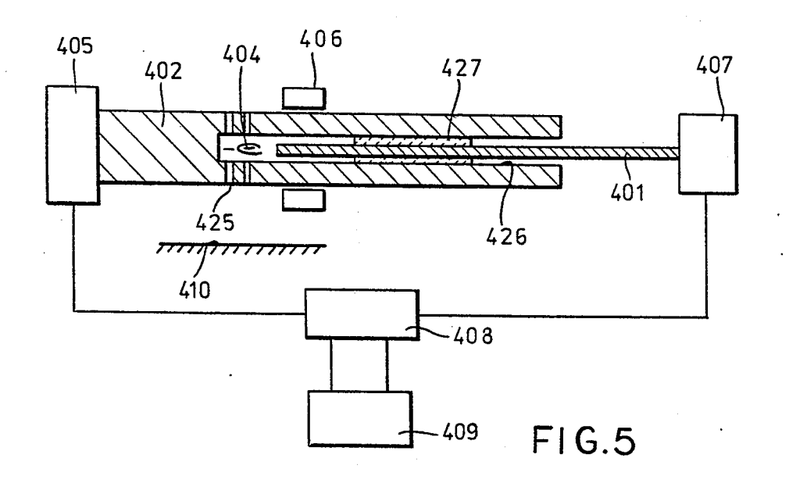
FIG. 5 is an axial cross-sectional view of another apparatus for depositing material upon a substrate according to this invention.

The embodiment of FIG. 5 evaporates the molten metal as it is formed in a closed space, the vapors being discharged through apertures 425 on the substrate 410.

In this case, the pool of liquid is formed by melting the electrode 402 supported by the holder 405 by feeding the counter electrode 401 via the electrode feeder 407 through a central bore 426 in the electrode 402, the electrode 401 passing through an insulating sleeve 427 forming a guide. A temperature regulator 406 is provided coaxially around the two electrodes adjacent the arc 404 to prevent overheating in the region ahead of the apertures 425. The deposit is formed on the substrate 410.

The current is supplied between the electrodes through the arc stabilizer 408 and the direct current source 409 in the manner described previously.

FIG. 6 shows a portable voltaic arc device for depositing reflective, anticorrosive, protective and semiconductor type metal, silicide and carbide coatings using the principles described previously.

This apparatus comprises a vacuum chamber 500 which is formed at its upper end with a handle 530 enabling the portable unit to be readily transported.

Within this chamber, there is provided a hollow sphere 517, the lower part of which forms a crucible for the molten metal 503, coated internally with a high-temperature heat-resistant (refractory) material such as aluminum oxide.

The upper portion of this sphere is coated at 531 with a reflective layer concentrating the heat reflected from the bath back onto the latter.

An arc 504 is struck between an electrode 501 and the bath 503, the electrode being fed by the unit 507 toward the bath as the electrode material is consumed.

Additional metal, e.g. in solid form, is fed to the bath as a rod 532 which also is connected to the feeder 533' so that as the bath is consumed, additonal metal is supplied thereto.

The electrode 501 and the bath 503 are connected to opposite terminals of an arc stabilizer and a direct current source in the manner previously described.

A tubular electrode 502 surrounds the rod 532.

The lower part of the chamber 500 is provided with an airpump as represented at 533, the latter evacuating the chamber containing the hollow sphere 517 and, via a vacuum hose 534, via a valve 535, an adapter 536 of outwardly divergent configuration which can be connected to a lateral aperture 525 of the hollow sphere 517.

The chamber 536 can be formed with a heating coil 537 to prevent undesired condensation of vapor thereon.

Between the aperture 525 and the adapter 536 there is provided a vacuum lock 538 and a mounting arrangement 539 for holding a variety of adapters of different shapes and sizes.

The adapter 536 is also formed with a vacuum gasket 540 whereby the adapter can bear against the substrate 510 to be coated.

The portable unit shown in FIG. 6 is carried to the location of the substrate 510 to be coated and the appropriate adapter 536 is mounted on the fitting 539 and the gasket 540 pressed against the surface 510 to be coated. The arc current is supplied and the system is evacuated by the air pump 533, thereby melting the metal and forming the bath 503 within the hollow sphere. The gate 538 is then opened and the vapors permitted to pass onto the substrate 510 at least in part by pressure differential as controlled by the valve 535 maintained between the interior of the sphere 517 and the adapter 536.

Practically any product at any site can be coated and the use of a variety of adapters of different shapes and sizes enables coating of even intricate bodies without moving them from the area in which they are to be used. The device can be collapsible so as to be used to provide coatings inside ducts and the like.

The apparatus shown in the drawing, without the adapter 536, can be used as a propellant for individuals or equipment in space.

Upon generation of the arc, one need only open the gate 538 to discharge a stream through the aperture 525 and effect propulsion in the opposite direction. The vacuum in space provides a natural vacuum for the device and no air pump 533 is then required. Practically any waste found in space applications can be utilized in the vessel 517 to generate such propulsion.

Figure 7:
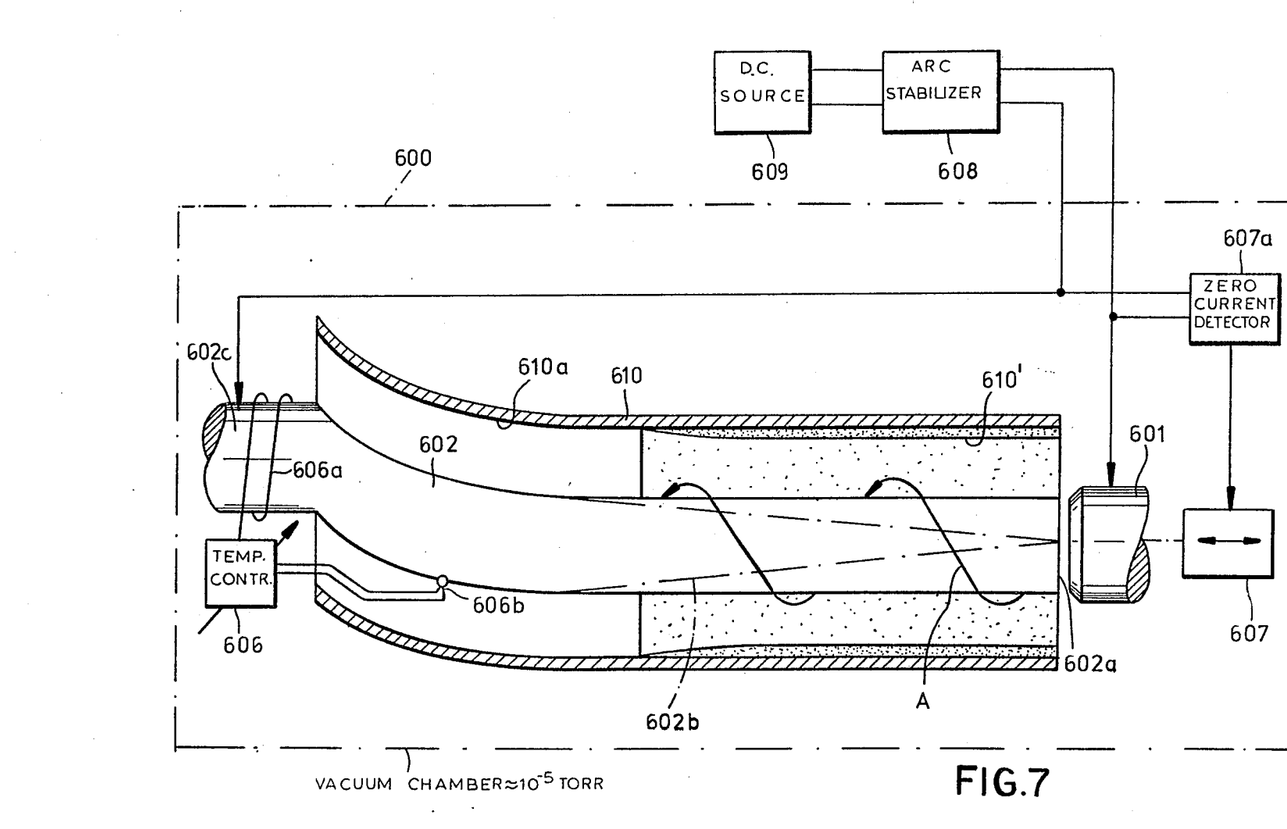
FIG. 7 is a diagrammatic cross sectional view of another apparatus for carrying out the present invention.

In FIG. 7 I have shown an embodiment of the invention which combines features previously described and concepts developed above.

In this system, which can be used to deposit a coating 610' on the inner surface 610a of a tube 610, forming a substrate, of complex shape, a material-supplying electrode 602 of corresponding shape is mounted centrally of the tube on a support 602a and is provided with an induction heating coil 606a of a temperature controller 606 which can have a thermocouple 606b or a like temperature sensor responsive to the temperature of the material-supplying electrode 602 for maintaining the temperature of the latter constant in the range of 800° to 1000° F. by conventional feed-back control circuitry.

As in the previous embodiment, the substrate and the source of the material to be deposited on the substrate are enclosed in a vacuum chamber 600 which can be evacuated to $10^{-6}$ torr so that vapor deposition can be effected at a pressure of $10^{-5}$ torr.

The end of the material-supplying electrode 602 is provided with an arc-striking electrode 601 which can be reciprocated toward and away from the electrode 602 by an electrically controlled reciprocating drive 607. The latter can be operated in response to a zero current detector 607a so that when the arc current decays completely, the electrode 601 is displaced to the left into contact with the end 602a of the electrode 602 and is then withdrawn to reestablish an arc. The arc current is provided by a pulsating direct current source 609 across which an arc stabilizer 608 the parameters of the arc current and arc voltage are adjusted within the range of 50 to 90 amperes and 30 to 60 volts by these circuit elements.

In practice, utilizing the system illustrated once the arc is struck, the arc itself, an evaporation effect or some other electromagnetic phenomenon appears to progress as represented by the arrow A generally helical and spiral where arc-striking location and vapor deposition takes place over the entire length of the material-supply electrode 602 which is subjected to this phenomenon, i.e. over the length at which the phenomenon is effective until the arc decays.

The material loss from the electrode 602 gradually transforms it into a tapered shape as represented by the doth-dash lines as 602b in FIG. 7.

The fact that the taper results in a recession of the electrode from the substrate does not create any problem of significance because the greatest deposit is at the region of greatest recession and consequently, the ultimate coating as it progresses along the substrate is highly uniform.

The system of the invention is especially useful in coating temperature-sensitive materials with very small thicknesses of coating material since the coating is especially rapid and it is possible to carry out the deposition without significantly heating up the substrate.

EXAMPLE 2

A copper electrode 602 of the shape shown is provided in a substrate tube with an initial spacing of electrode 602 from the substrate of about 10 cm. The electrode is maintained at a temperature of 900° F. and an arc is struck in the manner previously described at one end. The arc current is about 70 amperes and the voltage applied after the electrode 601 is withdrawn to form the arc is about 40 amperes. The speed of evaporation from electrode 602 under these conditions exceeds the speed of evaporation in Example 1.

I claim:

1. A method of depositing a material upon a substrate which comprises the steps of:
    juxtaposing an elongated electrode composed of at least one component of said material with a surface of said substrate along the length of said electrode;
    evacuating the space in which said electrode is juxtaposed with said substrate to at most $10^{-5}$ torr and maintaining the pressure in said space substantially no higher than $10^{-5}$ torr during deposition; and
    striking an electrical arc with said electrode at one end thereof at a voltage of substantially 30 to 60 volts and with a current of substantially 50 to 90 amperes to evaporate said electrode over a length thereof receding from said arc and to deposit the material evaporated from said electrode on said substrate over said length.

2. The method defined in claim 1, further comprising the step of monitoring the decay of said arc and restriking the arc upon such decay by contacting said electrode at said end with another electrode.

3. The method defined in claim 1, further comprising the step of controlling the temperature of said electrode to maintain said temperature in the range of substantially 800° F. to 1000° F.

4. The method defined in claim 1 wherein said substrate is a tube of complex contour, further comprising the step of shaping said elongated electrode in accordance with said contour and inserting the shaped electrode in said tube.

5. The method defined in claim 1, further comprising the step of heating the electrode which is evaporated at its end opposite the end at which said arc is struck to maintain the temperature thereof during deposition of said material at substantially 800° F. to 1000° F.

6. An apparatus for carrying out the method of claim 5 which comprises an elongated shaped electrode composed at least in part of a material to be deposited upon a substrate surface of complex shape, said electrode having a shape conforming to the complex shape of said substrate, means for striking an arc at one end of said electrode whereby material is evaporated from said electrode, means for heating said electrode at the opposite end thereof; and
    means for evacuating the space between said electrode and said substrate to a pressure of at most about $10^{-5}$ torr.

* * * * *

REEXAMINATION CERTIFICATE (3484th)
United States Patent [19]
Pinkhasov

[11] B1 4,609,564

[45] Certificate Issued  Apr. 14, 1998

[54] METHOD OF AND APPARATUS FOR THE COATING OF A SUBSTRATE WITH MATERIAL ELECTRICALLY TRANSFORMED INTO A VAPOR PHASE

[75] Inventor: Eduard Pinkhasov, Forest Hills, N.Y.

[73] Assignee: Masco VT, Inc., Taylor, Mich.

Reexamination Request:
No. 90/004,016, Nov. 14, 1995

Reexamination Certificate for:
Patent No.: 4,609,564
Issued: Sep. 2, 1986
Appl. No.: 494,302
Filed: May 13, 1983

Related U.S. Application Data

[63] Continuation-in-part of Ser. No. 358,186, Mar. 15, 1982, Pat. No. 4,438,153, which is a continuation-in-part of Ser. No. 237,670, Feb. 24, 1981, Pat. No. 4,351,855.

[51] Int. Cl.⁶ ............... H01T 14/00; C23C 13/00; C23C 13/12
[52] U.S. Cl. ............... 427/580; 427/230; 427/294; 118/723 R; 118/723 VE

[58] Field of Search ............... 427/580, 230, 427/294; 118/723 R, 723 VE

[56] References Cited

FOREIGN PATENT DOCUMENTS

| | | | |
|---|---|---|---|
| 711787 | 8/1980 | U.S.S.R. | C23C 15/00 |
| 1257015 | 12/1971 | United Kingdom | C23C 13/00 |
| 1322670 | 7/1973 | United Kingdom | C23C 13/12 |

OTHER PUBLICATIONS

Russian Inventor's Certificate No. 461163 (with attached Verification of Translation).

Sablev et al., Electrical-Arc Vaporizer of Metals with Magnetic Confinement of Cathode Spot, 1976.

*Primary Examiner*—Benjamin L. Utech

[57] ABSTRACT

Complex shapes are coated with material at least in part evaporated from an elongated electrode shaped to conform to the substrate and juxtaposed therewith over the length of the electrode. An arc is struck at one end and depositions occur over a surface of the electrode which recedes from the arc. The other end of the electrode is heated to maintain the electrode during deposition at a constant temperature.

REEXAMINATION CERTIFICATE ISSUED UNDER 35 U.S.C. 307

NO AMENDMENTS HAVE BEEN MADE TO THE PATENT

AS A RESULT OF REEXAMINATION, IT HAS BEEN DETERMINED THAT:

The patentability of claims 1–6 is confirmed.

* * * * *

(12) REEXAMINATION CERTIFICATE (4453rd)
United States Patent
Pinkhasov (10) Number: US 4,609,564 C2
(45) Certificate Issued: Oct. 9, 2001

(54) METHOD OF AND APPARATUS FOR THE COATING OF A SUBSTRATE WITH MATERIAL ELECTRICALLY TRANSFORMED INTO A VAPOR PHASE

(75) Inventor: Eduard Pinkhasov, Forest Hills, NY (US)

(73) Assignee: Masco VT, Inc., Taylor, MI (US)

Reexamination Request:
No. 90/004,958, Apr. 7, 1998

Reexamination Certificate for:
| Patent No.: | 4,609,564 |
|---|---|
| Issued: | Sep. 2, 1986 |
| Appl. No.: | 06/494,302 |
| Filed: | May 13, 1983 |

Reexamination Certificate B1 4,609,564 issued Apr. 14, 1998

Related U.S. Application Data (63) Continuation-in-part of application No. 06/358,186, filed on Mar. 15, 1982, now Pat. No. 4,438,153, which is a continuation-in-part of application No. 06/237,670, filed on Feb. 24, 1981, now Pat. No. 4,351,855.

(51) Int. Cl.$^7$ .............................. H01T 14/00; H01T 1/20; C23C 14/00; C23C 14/30
(52) U.S. Cl. ......................... 427/580; 427/230; 427/294; 118/723 R; 118/723 VE; 204/192.38; 204/298.41
(58) Field of Search .................................. 427/580, 230, 427/294; 118/723 R, 723 VE; 204/192.38, 298.41

(56) References Cited

U.S. PATENT DOCUMENTS 5,037,522 * 8/1991 Vergason .................... 204/298.41

FOREIGN PATENT DOCUMENTS

| 1257015 | 12/1971 | (GB) | ............................ C23C/13/00 |
| 1322670 | 7/1973 | (GB) | ............................ C23C/13/12 |
| 711787 | 8/1980 | (SU) | ............................ C23C/15/00 |

OTHER PUBLICATIONS

Kirichenko et al., "Vaporizer of Metal in a Vacuum," USSR Author's Certificate No. 461,163, (Feb. 2, 1975).
Sablev et al., Electrical–Arc Vaporizer of Metals with Magnetic Confinement of Cathode Spot, 1976.
Russian Inventor's Certificate No. 461163 (with attached Verification of Translation) Kirichenko et al.

* cited by examiner

*Primary Examiner*—Marianne Padgett (57) ABSTRACT

Complex shapes are coated with material at least in part evaporated from an elongated electrode shaped to conform to the substrate and juxtaposed therewith over the length of the electrode. An arc is struck at one end and depositions occur over a surface of the electrode which recedes from the arc. The other end of the electrode is heated to maintain the electrode during deposition at a constant temperature.

REEXAMINATION CERTIFICATE ISSUED UNDER 35 U.S.C. 307

NO AMENDMENTS HAVE BEEN MADE TO THE PATENT

AS A RESULT OF REEXAMINATION, IT HAS BEEN DETERMINED THAT:

The patentability of claims 1–6 is confirmed.

\* \* \* \* \*